United States Patent
Zheng et al.

(10) Patent No.: US 11,360,624 B2
(45) Date of Patent: Jun. 14, 2022

(54) TOUCH PANEL AND MANUFACTURING METHOD THEREOF

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Qitao Zheng, Beijing (CN); Zouming Xu, Beijing (CN); Lei Zhang, Beijing (CN); Jian Tian, Beijing (CN); Guiyu Zhang, Beijing (CN); Chunjian Liu, Beijing (CN); Xintao Wu, Beijing (CN); Tong Chen, Beijing (CN)

(73) Assignees: HEFEI XINSHENG OPTOELECTRONICS TECHNOLOGY CO., LTD, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 466 days.

(21) Appl. No.: 16/466,376

(22) PCT Filed: Nov. 8, 2018

(86) PCT No.: PCT/CN2018/114603
§ 371 (c)(1),
(2) Date: Jun. 4, 2019

(87) PCT Pub. No.: WO2020/000861
PCT Pub. Date: Jan. 2, 2020

(65) Prior Publication Data
US 2021/0357076 A1    Nov. 18, 2021

(30) Foreign Application Priority Data
Jun. 26, 2018 (CN) .......................... 201810673414.9

(51) Int. Cl.
*G06F 3/044* (2006.01)
*G06F 3/02* (2006.01)
*H03K 17/96* (2006.01)

(52) U.S. Cl.
CPC .......... *G06F 3/0446* (2019.05); *G06F 3/0202* (2013.01); *H03K 17/9622* (2013.01);
(Continued)

(58) Field of Classification Search
CPC .. G06F 3/0446; G06F 3/0202; H03K 17/9622
(Continued)

(56) References Cited

U.S. PATENT DOCUMENTS 8,335,993 B1 * 12/2012 Tan .................... G06F 3/04886
                                                        715/773
9,786,194 B2 * 10/2017 Hyman .................. B44C 3/046
(Continued)

FOREIGN PATENT DOCUMENTS

CN         2938613 Y   *  8/2007  ............. H04M 1/23
CN       201508539 U      6/2010
(Continued)

OTHER PUBLICATIONS

Office Action dated May 21, 2020, issued in counterpart CN Application No. 201810673414.9, with English Translation. (12 pages).
(Continued)

*Primary Examiner* — Prabodh M Dharia
(74) *Attorney, Agent, or Firm* — WHDA, LLP

(57) ABSTRACT

A touch panel may include a transparent substrate and a light blocking layer in a touch area and on a side of the transparent substrate. The light blocking layer may include a keyboard pattern, and the keyboard pattern may include hollow characters. The light blocking layer may be configured to display
(Continued)

the characters of the keyboard pattern on the light blocking layer by light passing through the hollow characters.

17 Claims, 15 Drawing Sheets

(52) U.S. Cl.
CPC .............. *G06F 2203/04103* (2013.01); *G06F 2203/04112* (2013.01); *H03K 2017/9602* (2013.01)

(58) Field of Classification Search
USPC .......................... 345/158, 168, 173; 715/773
See application file for complete search history.

(56) References Cited

U.S. PATENT DOCUMENTS

| | | | |
|---|---|---|---|
| 2012/0086651 A1 | 4/2012 | Kwon et al. | |
| 2015/0116255 A1* | 4/2015 | Zhong | G06F 3/0445 |
| | | | 156/182 |
| 2015/0324116 A1* | 11/2015 | Marsden | G06F 3/0231 |
| | | | 345/158 |
| 2015/0362948 A1* | 12/2015 | Wada | G06F 3/0445 |
| | | | 345/173 |

FOREIGN PATENT DOCUMENTS

| | | | | |
|---|---|---|---|---|
| CN | 202217608 U | | 5/2012 | |
| CN | 202422009 U | * | 9/2012 | .............. G06F 3/02 |
| CN | 103218047 A | | 7/2013 | |
| CN | 103309542 A | * | 9/2013 | ............. G06F 3/044 |
| CN | 103309542 A | | 9/2013 | |
| CN | 106020549 A | | 10/2016 | |
| CN | 206460433 U | * | 1/2017 | ............. G06F 3/041 |
| CN | 106557192 A | | 4/2017 | |
| CN | 206460433 U | | 9/2017 | |

OTHER PUBLICATIONS

Office Action dated Jul. 24, 2020, issued in counterpart CN Application No. 201810673414.9, with English Translation. (13 pages).
International Search Report dated Apr. 1, 2019, issued in counterpart application No. PCT/CN2018/114603 (10 pages).
Office Action dated Sep. 25, 2019, issued in counterpart CN application No. 201810673414.9, with English translation. (12 pages).

* cited by examiner

Related Art

TOUCH PANEL AND MANUFACTURING METHOD THEREOF

CROSS-REFERENCE TO RELATED APPLICATIONS

This application claims benefit of the filing date of Chinese Patent Application No. 201810673414.9 filed on Jun. 26, 2018, the disclosure of which is hereby incorporated in its entirety by reference.

TECHNICAL FIELD

The present disclosure relates to touch technology, and in particular, to a touch panel and a manufacturing method thereof.

BACKGROUND

As one of the most commonly used tools in the office, the keyboard has become an indispensable tool in daily life. A traditional mechanical keyboard controls input of the keyboard based on principle of contact point-on or contact point-off. The traditional mechanical keyboard has shortcomings such as loud noise, complicated structure, large thickness, and single function. A traditional capacitive keyboard implements keyboard input by detecting changes in capacitance due to distance changes after a finger presses. The traditional capacitive keyboard also has shortcomings such as complicated structure, large thickness, and single function.

BRIEF SUMMARY

An embodiment of the present disclosure provides a touch panel. The touch panel may include a transparent substrate and a light blocking layer in a touch area of the touch panel and on the transparent substrate. The light blocking layer may include a keyboard pattern, the keyboard pattern may include hollow characters, and the light blocking layer may be configured to display the characters of the keyboard pattern on the transparent substrate by light passing through the hollow characters.

The touch panel may further include a touch sensing layer in the touch area and on a side of the light blocking layer opposite from the transparent substrate. The touch panel may further include a light source at a side of the touch sensing layer opposite from the light blocking layer. The touch panel may further include a controller coupled to the light source and the touch sensing layer respectively. The controller may be configured to turn on the light source to display the keyboard pattern and realize a keyboard function based on sensing of touch operation by the touch sensing layer. The controller may be further configured to turn off the light source and realize a handwriting tablet function based on the sensing of touch operation by the touch sensing layer.

The touch panel may further include a switch button connected to the control module. The controller may be configured to control switching between the keyboard function and the handwriting tablet function of the touch panel based on a pressing operation or a touch operation on the switch button. The switch button may be a physical button in a non-touch area of the touch panel. In one embodiment, the switch button is a character in the keyboard pattern in the touch area of the touch panel.

Transmittance of the hollow characters maybe smaller than a light transmission threshold. The light transmission threshold may be about 30%. The hollow characters may be completely hollowed out. In one embodiment, the hollow characters are composed of a dot matrix-shaped black matrix or a mesh-shaped black matrix. The light blocking layer may include a plurality of black matrix blocks that are spaced apart, and the hollow characters of the keyboard pattern may be on the black matrix blocks respectively. The touch sensing layer may include first channels of sensing electrodes in a first direction and second channels of sensing electrodes in a second direction, and the first direction is different from the second direction.

Another example of the present disclosure is a method of fabricating a touch panel. The method may include forming a light blocking layer on a transparent substrate and forming a keyboard pattern in a touch area of the light blocking layer by a patterning process. The keyboard pattern may include hollow characters.

The method may further include forming a touch sensing layer in the touch area and on a side of the light blocking layer opposite from the transparent substrate. The hollow characters may include at least one of a completely hollow-out character, a hollow character composed of a dot matrix-shaped black matrix, or a hollow character composed of a mesh-shaped black matrix.

Forming the touch sensing layer may include forming a first insulating layer on the light blocking layer, forming a first metal layer on the first insulating layer and forming a first electrode layer by performing a patterning process on the first metal layer, forming a second insulating layer on the first electrode layer and the first insulating layer, forming a second metal layer on the second insulating layer and forming a second electrode layer by performing a pattern processing on the second metal layer, and forming a third insulating layer on the second electrode layer and the second insulating layer.

The first electrode layer may include first channels of sensing electrodes in a first direction, and the second electrode layer may include second channels of sensing electrodes in a second direction. The first direction may be different from the second direction.

Another example of the present disclosure is an electronic apparatus. The electronic apparatus may include the touch panel according to one embodiment of the present disclosure.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the present disclosure are apparent from the following detailed description taken in conjunction with the accompanying drawings in which:

DETAILED DESCRIPTION

Figure 1:
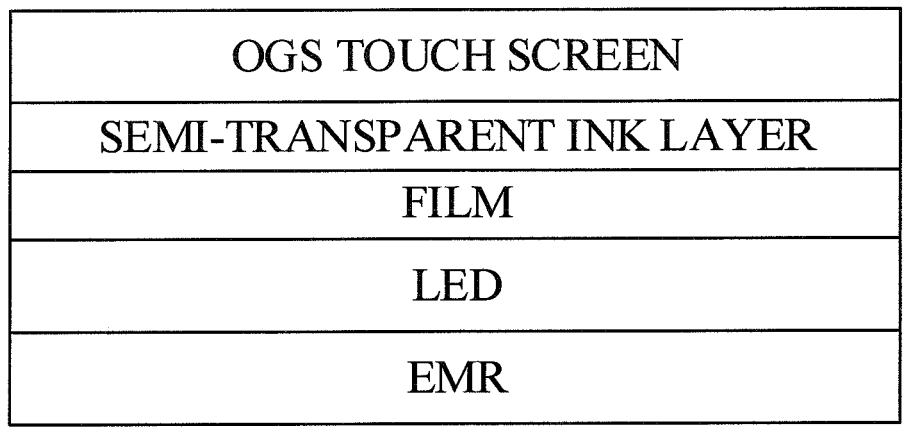
FIG. 1 is a schematic structural diagram of a capacitive touch keyboard in related art.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-15. When referring to the figures, like structures and elements shown throughout are indicated with like reference numerals. The specific features, structures, materials or characteristics described may be included in any suitable manner in any one or more embodiments or examples.

The illustrated steps may be performed in a computer system that can execute instructions. In some embodiments of the present disclosure, the steps shown or described may be performed in an order different than the ones described herein.

The following embodiments may be combined with each other, therefore, the same or similar concepts and steps are not repeated in some embodiments.

A capacitive touch keyboard has appeared in the market. The shape and the principle of the capacitive touch keyboard are similar to those of a touch screen. The capacitive touch keyboard utilizes a one glass solution (OGS) touch screen for realizing keyboard input by detecting changes in capacitance. FIG. 1 shows a schematic structural diagram of a traditional capacitive touch keyboard. As shown in FIG. 1, the capacitive touch keyboard adopts an OGS touch screen. To realize the touch keyboard function, a semi-transparent ink, an alphabet film (Film), and a light emitting diode (LED) light source are sequentially disposed on a side of the OGS touch screen opposite from a touch operational surface of the OGS touch screen. As such, the capacitive touch keyboard has a complicated hardware structure and composed of many film layers. Thus, the thickness of the capacitive touch keyboard is relatively large. In addition, as shown in FIG. 1, an electromagnetic resonance (EMR) is further disposed at a side of the LED light source of the capacitive touch keyboard opposite from the OGS touch screen. The additional EMR can integrate the function of an electromagnetic pen so that the touch keyboard can realize a handwriting tablet function. As shown in FIG. 1, the touch keyboard has a plurality of functions. However, the touch keyboard has a complicated structure. Furthermore, the capacitive touch function and the electromagnetic touch function of the touch keyboard are separately controlled, thereby requiring two integrated circuit (IC) chips. As a result, the capacitive touch keyboard has a high production cost.

Figure 2:
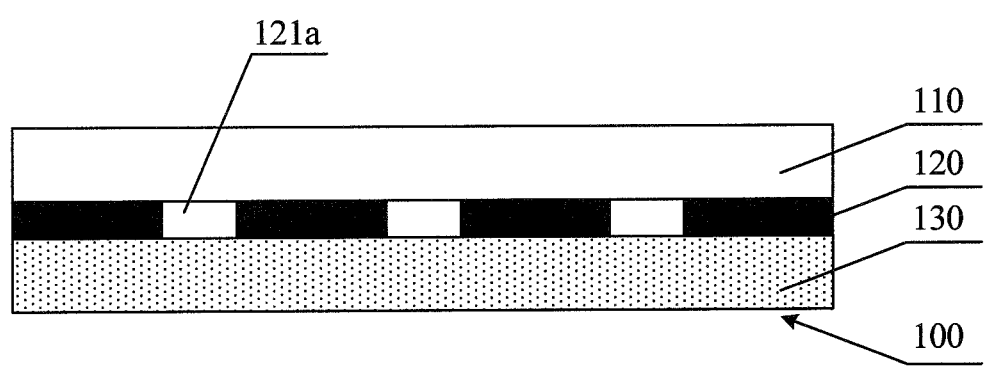
FIG. 2 is a schematic view of a cross-section of a touch panel according to one embodiment of the present disclosure.

FIG. 2 is a schematic structural diagram of a touch panel 100 according to one embodiment of the present disclosure. The touch panel 100 includes: a transparent substrate 110, a light blocking layer 120, and a touch sensing layer 130 sequentially disposed on a side of the transparent substrate 110 and located in a touch area.

Here, the light blocking layer 120 includes a keyboard pattern 120a. Every character 121a of the keyboard pattern 120a is set as a hollowed character. FIG. 2 is a schematic cross-sectional view of the touch panel 100, which does not show a complete keyboard pattern 120a.

In addition, the light blocking layer 120 is configured to display each character 121a of the keyboard pattern 120a on the light blocking layer 120 by the light passing through the hollow characters.

FIG. 2 illustrates a cross-sectional view of the OGS touch screen in the touch panel 100 according to one embodiment of the present disclosure. As shown in FIG. 2, the main structure of the touch panel 100 provided by the embodiment of the present disclosure is the optimized internal structure of the OGS touch screen.

In one embodiment, the OGS touch screen of the touch panel 100 includes a transparent substrate 110, a light blocking layer 120, and a touch sensing layer 130. Here, one side of the transparent substrate 110 has the light blocking layer 120 and the touch sensing layer 130. The other side of the transparent substrate 110 is a touch operational surface for a user to perform touch operation. An inner side of the transparent substrate 100 relative to the entire touch panel 100, that is, the side of the transparent substrate 110 opposite from the touch operational surface, is provided with the light blocking layer 120 and the touch sensing layer 130. The touch sensing layer 130 can adopt, for example, capacitive sensors to realize a capacitive touch panel. In one embodiment, the sensing electrode pattern in the touch sensing layer 130 can adopt, for example, a straight channel design.

In one embodiment, the OGS touch screen includes a touch area and a non-touch area. An inner side of the transparent substrate in the non-touch area includes a light blocking layer. Because the non-touch area located around the touch area is provided with metal wires of the sensing electrodes and other functional devices, the light blocking layer disposed in the non-touch area is located between the metal wires and the transparent substrate, and is used to shield the light of the touch area. Unlike the existing OGS touch screen, the OGS touch screen of the touch panel 100 according to one embodiment of the present disclosure includes the light blocking layer not only in the non-touch area (FIG. 1 only illustrates the touch area of the touch panel 100 and does not illustrate the non-touch area), but also in the touch area and at the side of the transparent substrate 110 opposite from the touch operational surface. The light blocking layer 120 of the present disclosure also includes the keyboard pattern 120a, and every character 121a of the keyboard pattern 120a is in a form of hollow character.

Figure 3:
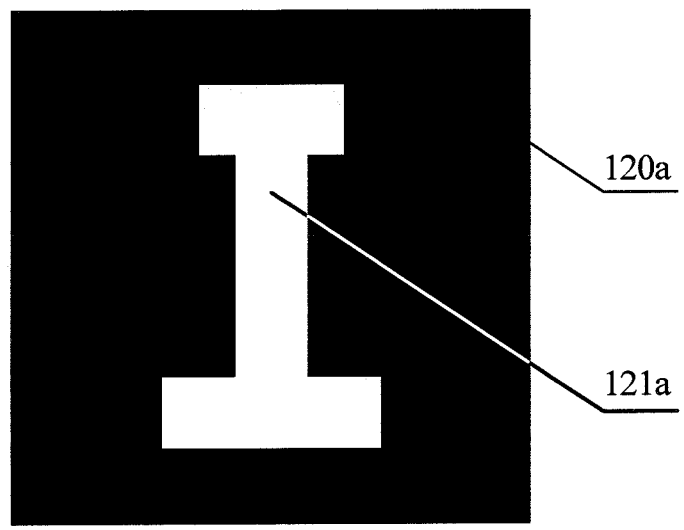
FIG. 3 is a schematic diagram of a character in a light blocking layer of a touch panel according to one embodiment of the present disclosure.

FIG. 3 is a schematic diagram of a hollow character in a light blocking layer of a touch panel according to one embodiment of the present disclosure. As shown in FIG. 3, for example, a hollow character "I" is in the light blocking layer 120 and the character "I" appeared in a fully hollow-out form. In other words, the embodiment of the present disclosure realizes a structure of a touch keyboard by integrating the keyboard pattern 120a into the light blocking layer 120 of the OGS touch screen. Furthermore, each of the characters 121a in the keyboard pattern 120a is completely hollowed out. As such, when a light irradiates the light blocking layer 120, the light can pass through the voids of each of the hollow characters 121a and display each of the characters 121a on the light blocking layer 120, thereby realizing the purpose of a touch keyboard.

Figure 4:
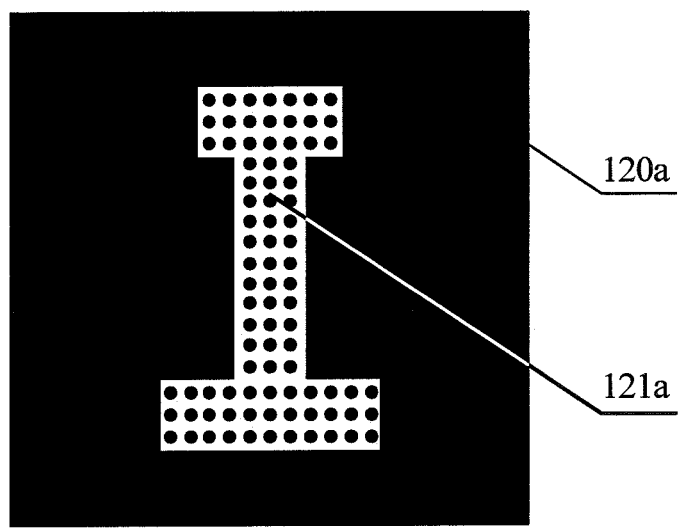
FIG. 4 is a schematic diagram of a character in a light blocking layer of a touch panel according to one embodiment of the present disclosure.
Figure 5:
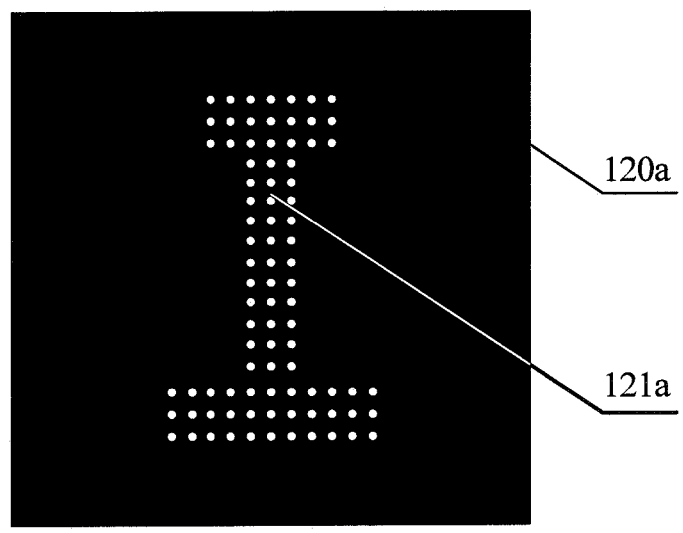
FIG. 5 is a schematic diagram of a character in a light blocking layer of a touch panel according to one embodiment of the present disclosure.

It should be noted that the hollow-out characters shown in FIG. 3 only illustrates one possible implementation of the characters in the light blocking layer 120. FIG. 4 is a schematic diagram of a hollow character in a light blocking layer of a touch panel according to some embodiments of the present disclosure. FIG. 5 is a schematic diagram of a hollow character in a light blocking layer of a touch panel according to some embodiments of the present disclosure. The hollow characters in the light-blocking layer 120 of the embodiment of the present disclosure may be in the form of completely hollow-out as shown in FIG. 3, or may be in the form of semi hollow-out effect. For example, the hollow character may be a hollow figure composed of a dot matrix-shaped black matrix (BM), as shown in FIG. 4, or a hollow figure composed of a mesh-shaped BM, as shown in FIG. 5.

As shown in FIG. 4, the character "I" is a hollow figure composed of a dot matrix-shaped black matrix. As shown in FIG. 5, the character "I" is a hollow figure composed of a mesh-shaped BM. A semi hollow-out effect is achieved by setting the void of the character "I" to the form of a BM dot matrix or a BM mesh. The semi hollow-out effect is beneficial for protecting eyes of the user. Furthermore, when the touch panel 100 is not in operation, the screen can achieve a full black effect.

In some embodiments of the present disclosure, a diameter and spacing of the BM dots as shown in FIG. 4 can be changed. In some embodiments, a diameter and spacing of the hollow dots in the BM mesh as shown in FIG. 5 can also be changed. As such, different transmittance requirements of the touch panel 100 can be achieved. In one embodiment, the light transmittance of the hollow characters is required to be less than a light transmission threshold, and the light transmission threshold is set to about 30%. As such, the effective display of the alphabet and the comfort of the user's eyes can be achieved.

The touch panel 100 provided by some embodiments of the present disclosure integrates the keyboard pattern of the touch keyboard into the OGS touch screen. The keyboard pattern is displayed to the user through the hollow characters of the light blocking layer 120. Comparing to the existing touch keyboard in FIG. 1, the touch panel 100 provided in some embodiments of the present disclosure reduces one alphabet film and one layer of semi-transparent ink. As a result, the touch keyboard of the present disclosure is thinner and lighter, and has a lower production cost. In addition, in some embodiments of the present disclosure, the semi hollow-out effect can be achieved by applying hollow characters composed of dots matrix-shape dBM or mesh-shaped BM. As such, when the touch panel 100 is not in operation, the screen approaches full black, and when the touch panel 100 is in operation, the void of the hollow characters is brightly displayed.

Furthermore, the light blocking layer 120 having the keyboard pattern of the present disclosure does not require additional processing step. When a light blocking layer in a non-touch area is being formed on the touch panel 100, the light blocking layer in a touch area having a keyboard pattern can also be formed at the same time by only changing a mask pattern of the light blocking layer. Therefore, the present disclosure has fewer processing steps and lower production cost.

In some embodiments of the present disclosure, a light blocking layer 120 having a keyboard pattern is provided inside the OGS touch screen (specifically, on a side of the transparent substrate 110 that is close to the touch sensing layer 130) of the touch panel 100. Each of characters 121a in the keyboard pattern 120a of the light blocking layer 120 is hollowed out. As such, when a light pass through the hollow pattern of the light blocking layer 120, the light blocking layer 120 can display a complete keyboard.

The touch panel 100 provided by the present disclosure integrates the keyboard pattern of a traditional keyboard into a traditional OGS touch screen. That is, by reasonably designing the pattern of the light blocking layer in the touch area, a touch panel having a keyboard pattern is realized. As a result, the touch panel has fewer film layers and simpler hardware structure. Moreover, the manufacturing method is easier and the production cost of the touch panel is reduced.

In some embodiments of the present disclosure, when the touch panel is in operation, the keyboard pattern in the light blocking layer 120 can be displayed on the transparent substrate 110 through illumination of the light source 120 away from the transparent substrate 110.

In some embodiments of the present disclosure, the light source may be an external light source. For example, the entire touch panel 100 may be disposed on a light emitting side of a light source, and the transparent substrate 110 may be disposed on a side of the display panel that is away from the light source. As such, the light emitted by the light source passes through the hollow characters in the light blocking layer 120, and the complete keyboard pattern 120a can be displayed onto the transparent substrate 110 for the user to touch the displayed touch keyboard.

Figure 6:
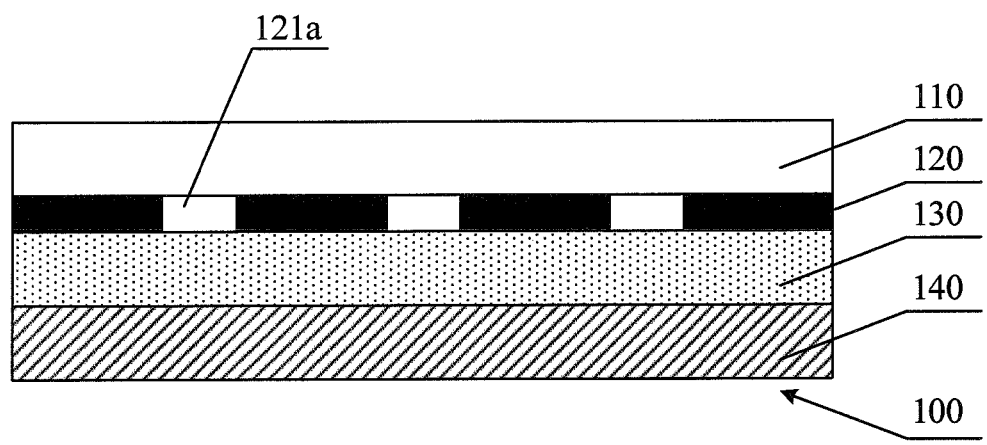
FIG. 6 is a schematic structural diagram of a character in a light blocking layer of a touch panel according to one embodiment of the present disclosure.

In some embodiments of the present disclosure, a light source may be built into a touch panel 100. FIG. 6 is a schematic structural diagram of a touch panel according to some embodiments of the present disclosure. As shown in FIG. 6, the touch panel includes a light source 140 disposed on a side of a touch sensing layer 130 opposite from the light blocking layer 120. The light source 140 can be, for example, a light emitting diode (LED). It should be noted that a built-in light source in the touch panel 100 is more convenient to use.

Alternatively, in some embodiments of the present disclosure, the touch panel 100 further includes a controller that is respectively coupled to the light source 140 and the touch sensing layer 130.

In one embodiment, the controller is configured to turn on the light source 140 to display the keyboard pattern 120a of the touch panel 100, and to implement the keyboard function based on sensing of the touch operation by the touch sensing layer 130.

In one embodiment, the controller is further configured to turn off the light source and to implement a handwriting tablet function based on sensing of the touch operation by the touch sensing layer 130.

In some embodiments of the present disclosure, the controller can control the light source 140 to be turned on or off, and can also detect a change of the capacitance caused by a user's operation on the touch sensing layer 130. For example, when the keyboard function of the touch panel 100 is in operation, the light source 140 is turned on and the light passes through the hollowed characters in the light blocking layer 120 and the voids of each of the hollowed characters 121*a* of the keyboard pattern 120*a* are illuminated, thereby causing the entire keyboard pattern 120*a* to appear on the touch panel 100. Therefore, when the user performs a touch operation on the displayed keyboard pattern 120*a*, the input function of the keyboard is realized based on the sensing function of the touch sensing layer 130.

In another application scenario, the touch panel 100 provided by the embodiment of the present invention turns off the light source 140 when it is not in operation. In some embodiments of the present disclosure, the touch panel 100 may also turn off the light source 140 to implement a handwriting tablet function. That is, when the keyboard function is not being used, the controller may turn off the light source 140 so that the screen of the touch panel 100 is in a dark state. At this time, the touch panel 100 may be used as a handwriting tablet, and perform writing and drawing functions in response to a user's finger or an active pen such as a tilt active pen, thereby realizing a handwriting tablet operation.

In some embodiments of the present disclosure, the touch panel 100 may include, for example, an OGS capacitive touch screen that supports an active pen that supports a tilt function (hereinafter a tilt active pen). The structure of the OGS capacitive touch screen has been described in detail in the above embodiments, that is, the OGS capacitive touch screen includes a transparent substrate 110, a light blocking layer 120, and a touch sensing layer 130. A keyboard pattern 120*a* is realized by a light blocking layer 120 on a side of the transparent substrate 110 that is away from a touch operational surface. In other words, the embodiment of the present disclosure adopts an OGS capacitive touch screen that supports a tilt active pen to realize the dual functions of a touch keyboard and a handwriting touch tablet so that a single IC chip can be used to control the two touch functions. In the keyboard function, the light source is turned on and the keyboard pattern displays on the touch panel 100. That is, the keyboard function is turned on. At this time, a touch operation can be performed by touching the characters 121*a* of the keyboard pattern 120*a* using a finger or an active pen, and the touched characters can be inputted. In the handwriting tablet function, the light source is turned off and the screen of the touch panel 100 is in a dark state. Touch operation can be performed by a finger or active pen to realize the function of the handwriting tablet, such as performing writing, drawing, etc. In addition, the current Tilt active pen has 4096 levels of pressure sensitivity and is written like a real pencil or a brush, which greatly enriches the user's touch experience. Comparing to the existing touch panel supporting touch keyboard function and handwriting tablet function, the touch panel of the present disclosure eliminates one electromagnetic touch panel and one electromagnetic IC chip. Therefore, the touch panel of the present disclosure has a lower manufacturing cost.

Alternatively, the touch panel 100 in some embodiments of the present disclosure further includes a switch button that is connected to the control module.

The controller in the embodiments of the present disclosure is further configured to switch between the keyboard function and the handwriting tablet function of the touch panel based on a press operation or a touch operation of the switch button 150.

Figure 7:
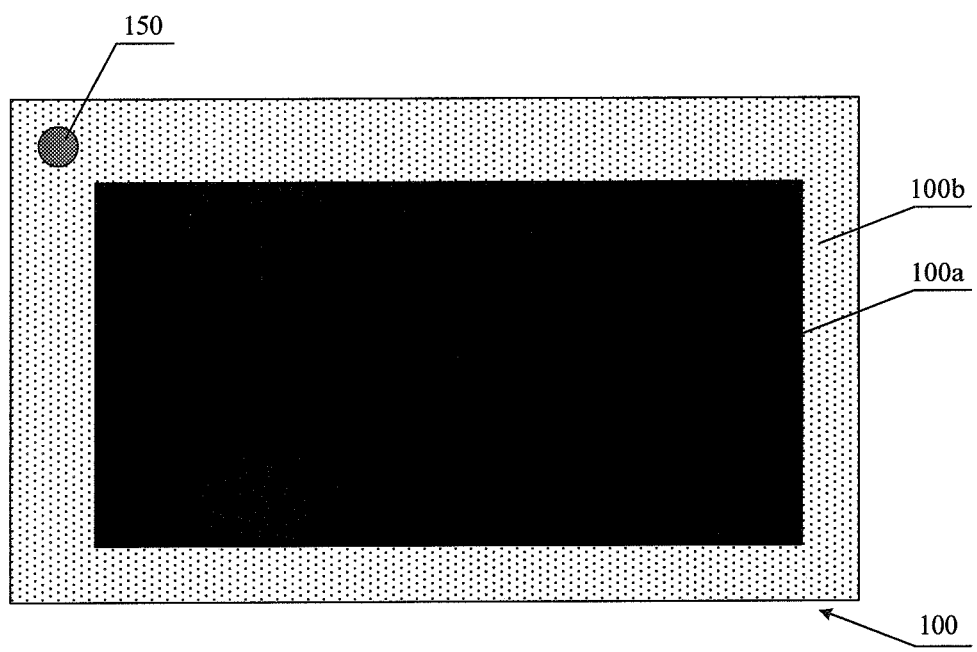
FIG. 7 is a top view of a touch panel according to one embodiment of the present disclosure.

In some embodiments of the present disclosure, the switch button 150 may be a physical button disposed in a non-touch area of the touch panel 100. FIG. 7 is a top view of a touch panel according to one embodiment of the present disclosure. The touch panel 100 has a touch area 100*a* and a non-touch area 100*b*. A keyboard pattern 120*a* in the above embodiment is located in the touch area 100*a*, and a switch button 150 is provided as a physical button that is located in the non-touch area 100*b*, such as the upper left corner of the touch panel 100. By pressing the switch button 150, a user can switch the function that is currently being implemented by the touch panel 100. As such, the switch function of the keyboard function and the handwriting tablet function of the touch panel 100 is realized.

Figure 8:
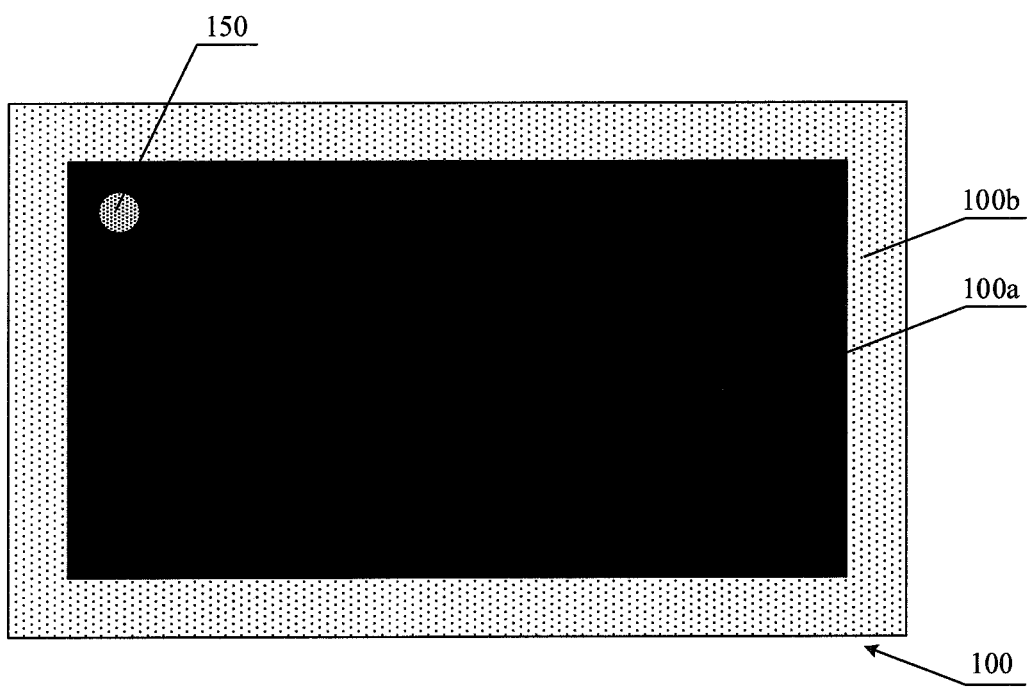
FIG. 8 is a top view of a touch panel according to one embodiment of the present disclosure.

In some embodiments of the present disclosure, the switch button 150 can be a touch button disposed in the touch area. A top view of a touch panel according to one embodiment of the present invention is shown in FIG. 8. The touch panel 100 has a touch area 100*a* and a non-touch area 100*b*. The keyboard pattern 120*a* in the above embodiment is located in the touch area 100*a*, and the switch button 150 is a character in the keyboard pattern 120*a*, such as at an upper left corner of the keyboard pattern 120*a*. The switch button 150 is similar to other characters in the keyboard pattern 120*a*, and can also be in the form of a hollow character. When the user touches the switch button 150, the capacitance of the touch sensing layer 130 at the position of under orthographic projection of the switch button 150 changes and the change in the capacitance at the above position in the touch sensing layer 130 is detected by the control module, thereby causing a reaction. That is, the current function mode of the touch panel 100 is switched once. As a result, the switching between the touch keyboard function and the handwriting tablet function of the touch panel 100 is realized.

Figure 9:
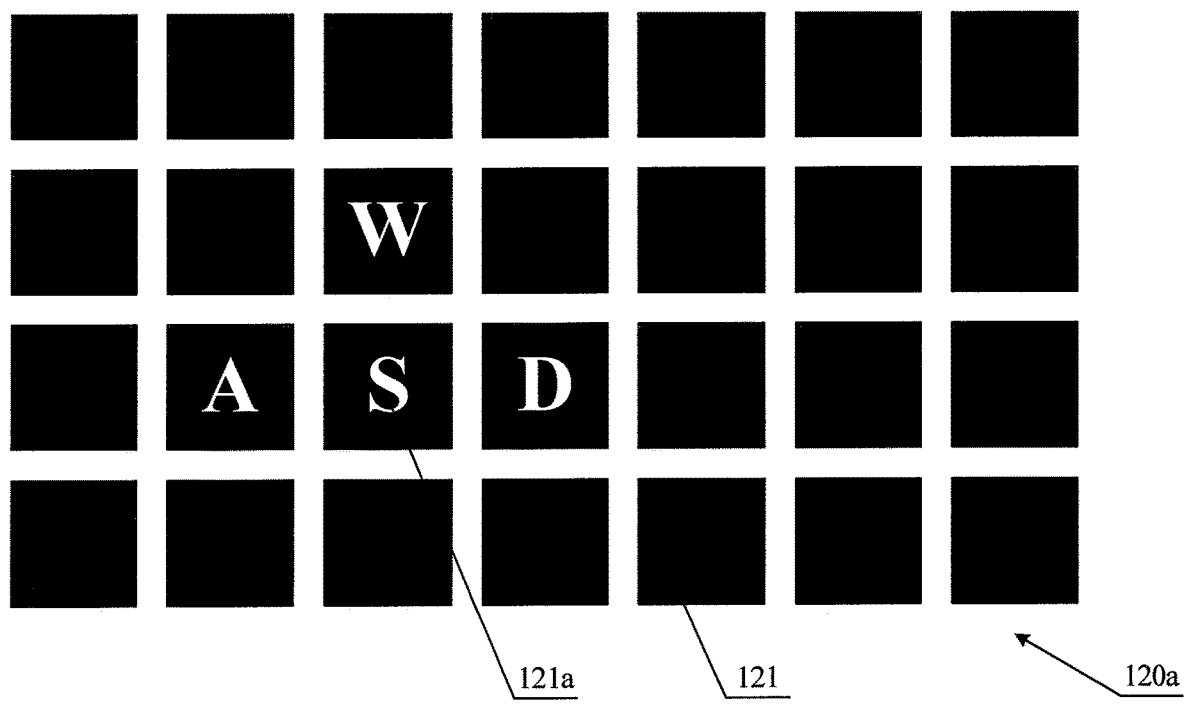
FIG. 9 is a schematic diagram of a keyboard pattern in a light blocking layer of a touch panel according to one embodiment of the present disclosure.

Optionally, in some embodiments of the present disclosure, the light blocking layer 120 includes a plurality of BM blocks 121. The plurality of BM blocks 121 is spaced-apart, and the characters 121*a* in the keyboard pattern 120*a* are disposed on various BM blocks 121. In one embodiment, the number of BM blocks 121 in the light blocking layer 120 may be the same as that of the characters 121*a* in the keyboard pattern 120*a*. That is, the BM blocks 121 may have a one-to-one correspondence with the characters 121*a*. Also, there is a predetermined interval among the BM blocks 121. FIG. 9 is a schematic diagram of a keyboard pattern in a light blocking lawyer of a touch panel according to one embodiment of the present disclosure.

Figure 10:
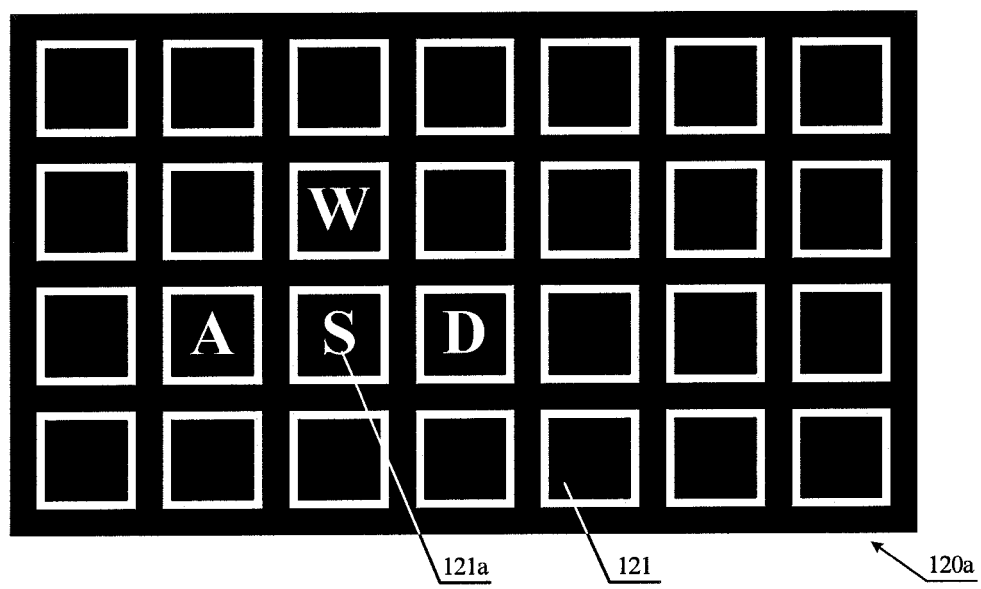
FIG. 10 is a schematic diagram of a keyboard pattern in a light blocking layer of a touch panel according to one embodiment of the present disclosure.

In another embodiment, each of the characters 121*a* that has been defined by the BM block 121 has a frame around the periphery. The frame may be the interval between the BM blocks, and the frames of adjacent characters can be separated by BM. FIG. 10 is a schematic diagram of a keyboard pattern in a light blocking layer of a touch panel according to one embodiment of the present disclosure.

It should be noted that, as shown in FIGS. 9 and 10, the intervals between the BM blocks 121 and the frames around the characters (the interval between a BM block 121 and an adjacent BM block) in the keyboard pattern 120*a* of the light blocking layer are disposed in the light blocking layer 120 in the form of hollowed out patterns. The design of such intervals may be similar to the characters, that is, the intervals can be completely hollowed out or semi-hollowed out. In addition, FIGS. 9 and 10 only schematically show a portion of the characters 121a of the keyboard pattern 120a. The keyboard pattern 120a of the touch panel 100 in the embodiment of the present disclosure is not limited by the keyboard pattern shown in the figures.

Figure 11:
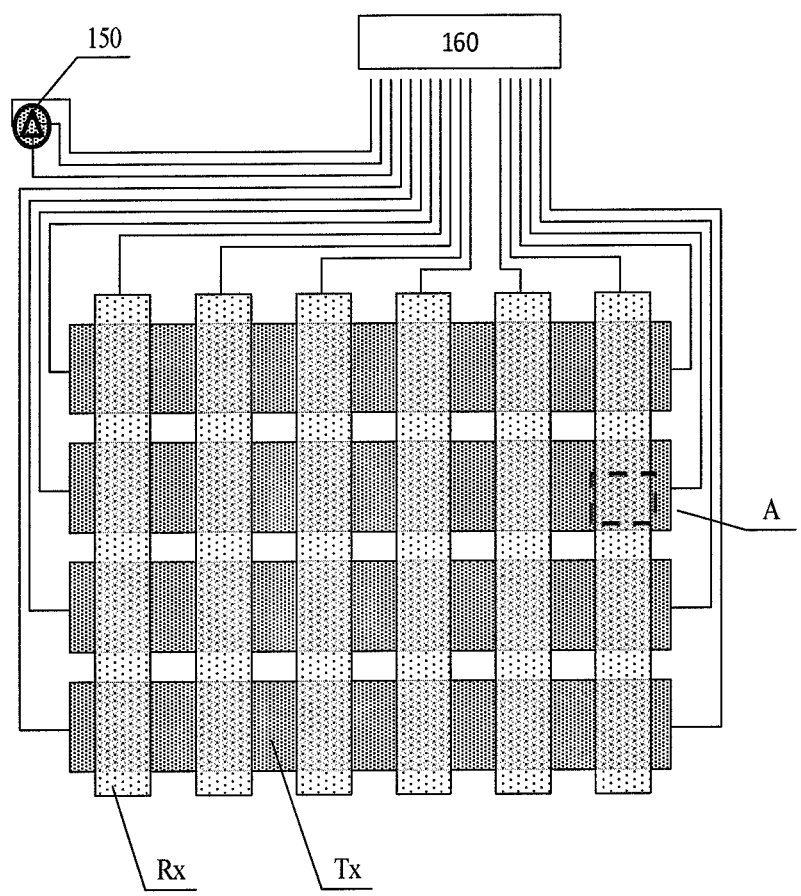
FIG. 11 is a schematic diagram of a touch panel in a channel form according to one embodiment of the present disclosure.
Figure 12:
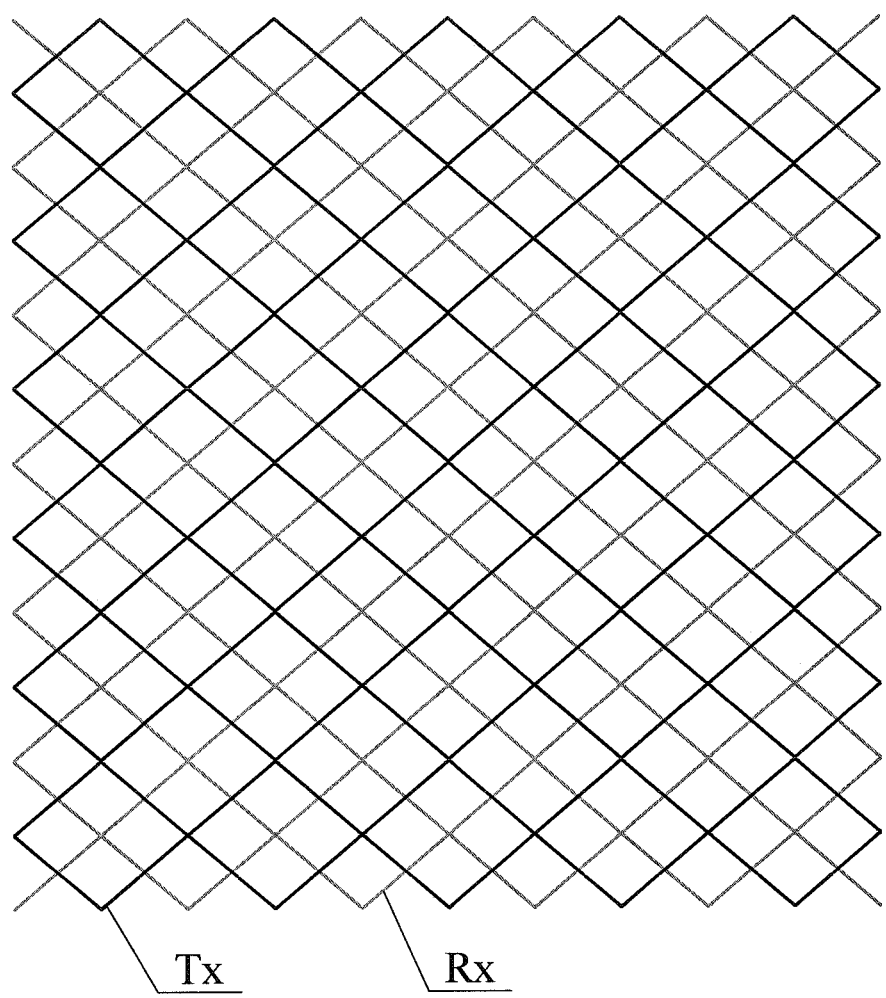
FIG. 12 is a schematic enlarged view of area A of an electrode pattern in the channel shown in FIG. 11.

In some embodiments of the present disclosure, the touch panel 100 integrates a touch keyboard and a handwriting tablet into a touch apparatus, such as, by utilizing an OGS touch screen that supports a tilt active pen. An electrode pattern of the touch screen may adopt, for example, a straight channel design. FIG. 11 is a schematic diagram of a touch panel having straight channel design according to one embodiment of the present disclosure. As shown in FIG. 11, the sensing electrodes are designed in the form of straight channels, and the channel width can be designed in accordance to the design requirement of the tilt active pen. FIG. 12 is a schematic enlarged view of area A of the straight channel in FIG. 11. A switch button 150 is located in the non-touch area in FIG. 11, that is, the switch button 150 is located in an area outside the sensing electrode. In the embodiment of the present disclosure, the horizontal channels Tx of the touch electrode, the vertical channels Rx of the touch electrode, and the switch button 150 are all connected to a processor 160. As shown in FIG. 11, metal wires are provided on both sides of the horizontal channel Tx, but only on the upper side of the vertical channels Rx. In some embodiments, the channels may be wired single-sided or double-sided. The double-sided wiring has better performance. One-sided wiring can be used when the area of frame of the touch panel 100 is not sufficiently large. The electrode pattern as shown in FIG. 12 has a metal mesh structure that includes the horizontal channels Tx and the vertical channels Rx. The horizontal channels intersect with the vertical channels to form the metal mesh structure. Here, the horizontal channels Tx are shown as black lines and the vertical channels Rx are shown as dark gray lines. The horizontal channels Tx and the vertical channels Rx are two types of electrodes with an insulating layer between them. The insulating layer can be, for example, an organic insulating layer. The above mentioned design of the channels can support the tilt active pen. The tilt active pen can support 4096 levels of pressure sensitivity which can simulate the writing of a calligraphy brush, thereby enriching greatly the consumer experience. At the same time, by a firmware (FM) adjustment, the effect of inputting different letters by a pressed finger at different positions can be realized.

A method of fabricating the touch panel 100 according to any of the above embodiments of the present invention is provided.

Figure 13:
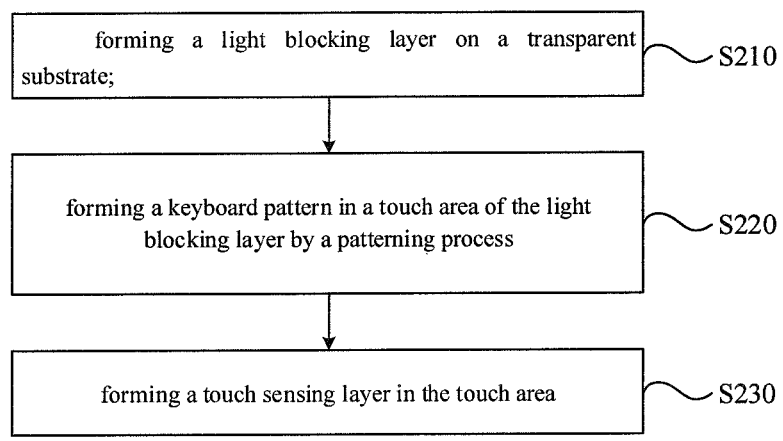
FIG. 13 is a flowchart of a method of fabricating a touch panel according to one embodiment of the present disclosure.

FIG. 13 is a flow chart of a method of fabricating a touch panel according to one embodiment of the present disclosure. The method includes the following steps:

In step S210, a light blocking layer is formed on a transparent substrate.

In step S220, a patterning process is performed on the light blocking layer of the touch area to form a light blocking layer on the transparent substrate. The light blocking layer includes a keyboard pattern and each of the characters of the keyboard pattern is hollowed out.

In some embodiments of the present disclosure, the touch panel is an OGS touch screen. Each layer of the OGS touch screen is formed on a transparent substrate, and an entire light blocking layer can be formed on the transparent substrate. The light blocking layer is located in the non-touch area and the touch area of the touch panel. For the touch panel that is subsequently fabricated, because the non-touch area adjacent to the touch area includes metal wires for the sensing electrode and other components, the light blocking layer of the non-touch area is located between the metal wires and the transparent substrate, and used to shield the light from the touch area.

The existing OGS touch screen forms the light blocking layer only in the non-touch area. That is, first, the entire light blocking layer is formed. Then, the entire light blocking layer undergo a patterning process, for example, by gluing, exposure, developing, etching, and stripping, so that only the light blocking layer in the non-touch area is retained. Unlike the existing OGS touch screen, the touch panel according to some embodiments of the present disclosure integrates a keyboard pattern in the touch panel. When the light blocking layer undergoes a patterning process, a keyboard pattern can be formed in the touch area of the light blocking layer by only changing a mask pattern used in the patterning process. Also, each of the characters of the keyboard pattern is a hollow character.

In some embodiments, the characters can be completely hollowed out, as shown in FIG. 3. The characters can also have a semi hollow-out effect. For example, the voids of the characters can be in the form of BM dot matrix or BM mesh, as shown in FIGS. 4 and 5. Therefore, in the method of the embodiment of the present disclosure, when the light blocking layer of the touch area undergoes the patterning process, the light blocking layer being hollowed out include formation of the hollow characters and BM dot matrix or BM mesh inside the characters.

In the touch panel fabricated by the method of one embodiment of the present disclosure, predetermined intervals may be formed among the characters in the keyboard pattern. The intervals in the light blocking layer divide the light blocking layer into a plurality of BM blocks and different characters of the keyboard pattern may be located on different BM blocks respectively. The corresponding relationship between the characters and the BM blocks, and the specific structure of the keyboard pattern formed on the light blocking layer may be referred to FIGS. 9 and 10. In addition, the intervals of the light blocking layer may have a pattern that is similar to the hollow characters, that is, the intervals can be completely hollowed out or in the form having a semi-hollowed out effect.

In step S230, a touch sensing layer is formed on the touch area of the light blocking layer.

In a method of fabricating a touch panel in some embodiments of the present disclosure, after the keyboard pattern has been formed in the touch area of the light blocking layer, a touch sensing layer can also be formed on the light blocking layer. That is, a structure that is capable of touch operation of the touch panel including, such as, a sensing electrode and corresponding metal wires, is formed. The pattern of the sensing electrode in the touch sensing layer may adopt a straight channel design. Details of the channels and the electrode pattern may be referred to FIGS. 11 and 12 in the above embodiments.

The touch panel in the embodiments of the present disclosure integrates a keyboard pattern of a traditional keyboard into an OGS touch screen. The keyboard pattern is displayed to the user through the hollowed out patterns of the light blocking layer. As such, the touch panel fabricated by the method of the embodiments of the present disclosure can reduce one alphabet film and one layer of semi-transparent ink. Therefore, the touch panel of the present disclosure is lighter and has a lower production cost than the traditional touch keyboard. In addition, in the embodiments of the present disclosure, the hollowed out pattern can be formed by the BM dot matrix or BM mesh to achieve a semi-hollowed out effect. As a result, a screen having a full black effect can be realized when the touch panel is not in operation. When the touch panel is in operation, the voids of the hollowed out keyboard pattern of the light blocking layer can appear bright. In addition, the light blocking layer of the keyboard pattern does not need any additional special processing step. That is, when the light blocking layer of the non-touch area of the touch panel is formed, the light blocking layer of the touch area having the keyboard pattern can be simultaneously formed by only changing the mask pattern of the light blocking layer. As a result, additional process steps are avoided and production cost is reduced which are conducive to cost savings.

The method of fabricating the touch panel in the embodiments of the present disclosure forms a light blocking layer on a transparent substrate. A keyboard pattern is formed in a touch area of the light blocking area when the light blocking layer undergoes a patterning process. That is, the light blocking layer having the keyboard pattern is integrated into a traditional OGS touch panel. Each of the characters of the keyboard pattern of the light blocking layer is hollowed out so that a complete keyboard pattern can be displayed from the light blocking layer when a light passes through the hollow characters in the light blocking layer. The method of fabricating the touch panel of the embodiments of the present disclosure integrates the keyboard pattern of a traditional keyboard into a traditional OGS touch panel. That is, the keyboard pattern of the touch panel is realized by reasonably designing the pattern of the touch area of the light blocking layer so that a touch panel having a simpler hardware structure and fewer film layers is realized. Furthermore, it is easier to produce the touch panel in the embodiments of the present disclosure, which has a lower hardware cost.

Figure 14:
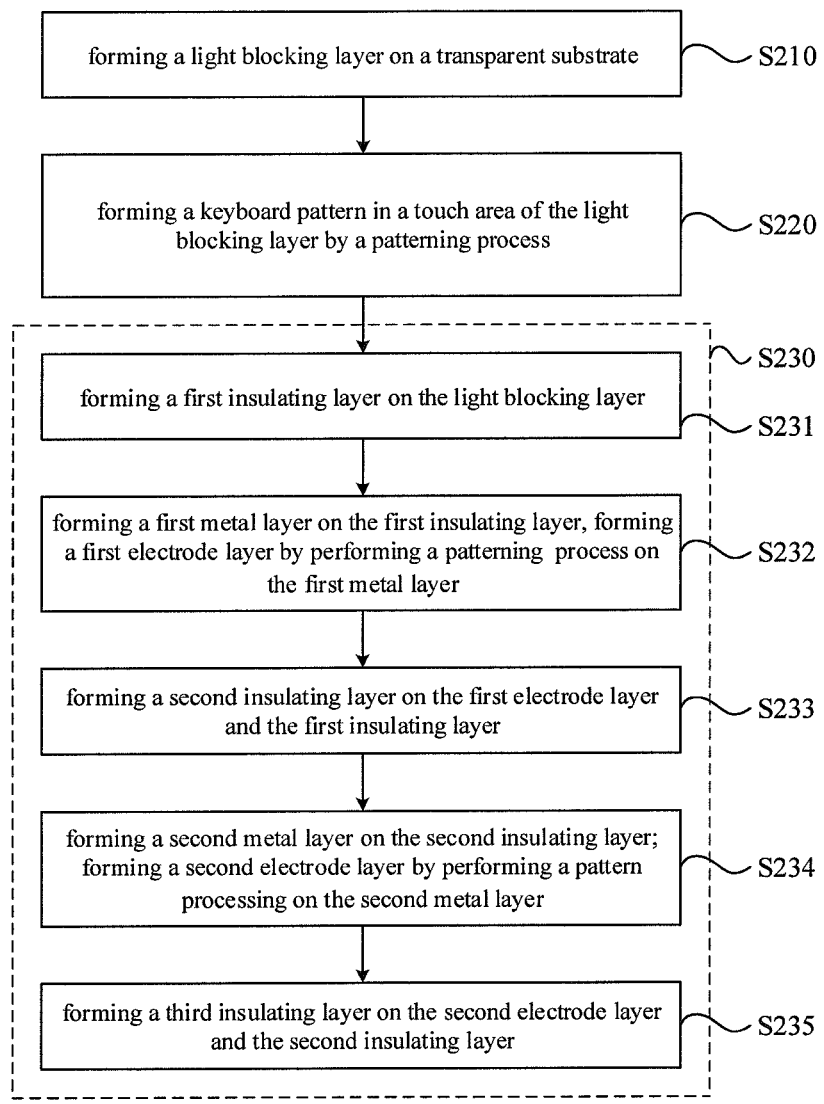
FIG. 14 is a flowchart of a method of manufacturing a touch panel according to one embodiment of the present disclosure.

FIG. 14 is a flow chart of a method of fabricating a touch panel according to one embodiment of the present disclosure. On the basis of the procedures in FIG. 13, step S230 of the method may further include the following:

In step S231, a first insulating layer is formed on the light blocking layer. The first insulating layer can be an organic insulating layer such as an organic polymer (OC) layer coated on the light blocking layer, which will be referred as an OC0 layer.

In step S232, a first metal layer is formed on the first insulating layer, and the first metal layer undergoes a patterning process to form a first electrode layer (M1). In one embodiment, first, the first metal layer is formed on the OC0 layer and undergoes a patterning process such as by gluing, exposure, developing, etching, and stripping . . . etc. The first electrode layer (i.e., M1) formed by using the first metal layer may be, for example, first channels of the sensing electrodes in a first direction.

In step S233, a second insulating layer is formed on the first electrode layer and the first insulating layer. The second insulating layer can be an organic insulating layer, which will be referred here as an OC1 layer.

In step S234, a second metal layer is formed on the second insulating layer. The second metal layer undergoes a patterning process to form a second electrode layer. The second metal layer is formed in a process similar to the first metal layer. The second electrode layer (M2) formed by using the above second metal layer, for example, can be second channels of the sensing electrodes in a second direction, which is different from the first direction.

In step S235, a third insulating layer is formed on the second electrode layer and the second insulating layer. After the above mentioned touch sensing layer is completely formed, the third insulating layer (referred here as an OC2) may be formed to protect the above structure of the touch sensing layer. The third insulating layer may also be an organic insulating layer.

In the method of fabricating the touch panel of the embodiments of the present disclosure, prior to the formation of the OC1 layer, metal wires may be formed first at the non-touch area of the touch panel. The metal wires includes metal wires connecting the horizontal sensing electrodes and the vertical sensing electrodes to a flexible printed circuit and metal wires of a bonding area for bonding the FPC to achieve signal conduction.

Figure 15:
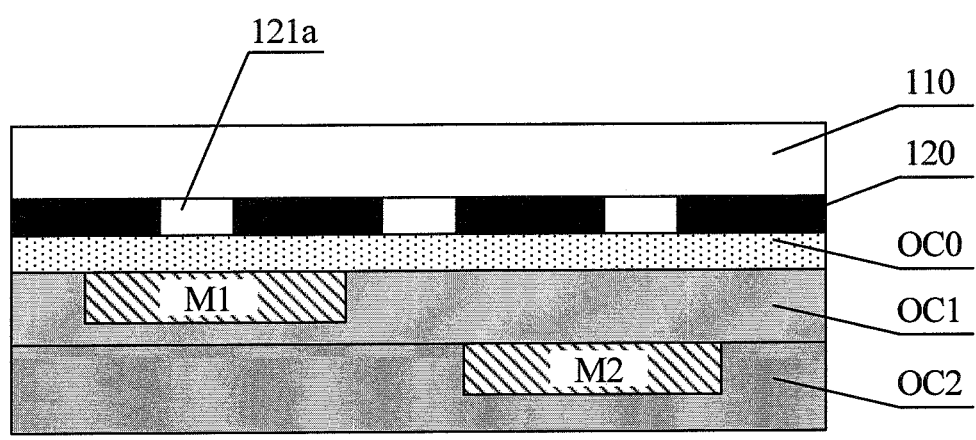
FIG. 15 is a schematic structural diagram of a touch panel according to one embodiment of the present disclosure.

FIG. 15 is a schematic structural diagram of a touch panel fabricated by a method of an embodiment of the present disclosure. FIG. 15 shows a cross-sectional view of a touch area of a touch panel. The touch panel includes a transparent substrate 110, a touch area of a light blocking layer 120 having a keyboard pattern, and a touch sensing layer 130 including OC0, M1, OC1, M2, and OC2.

In the method of the embodiments of the present disclosure, the touch panel 100 may be considered as a unit. A substrate may include a plurality of touch units 100. After the fabrication method is completed, the touch units 100 fabricated on one substrate need to be separated by cutting. Since a laser cutting process is used when the substrate is being cut, the cutting path cannot contain any patterns. As such, in the formation of OC0, OC1 and OC2, a patterning process can also be used, that is, the film layers of OC0, OC1 and OC2 on the cutting path are removed by processes such as gluing, exposure, development, etching and stripping.

It should be noted that in the touch panel fabricated by the method of the present disclosure, the structure of the layers in the touch area is the same as the structure of the touch panel 100 provided in the above embodiments. Other hardware structures (such as the light source and the control module) are fabricated in a similar manner to the existing technology so they are not described here.

Another example of the present disclosure is an electronic apparatus. The electronic apparatus includes the touch panel 100 of any of the above embodiments of the present disclosure. The electronic apparatus can be, for example, a laptop computer, an automated teller machine (ATM), or the like that can support the keyboard function and the hand writing input functions. The electronic apparatus can also be an external input apparatus for a desktop or a tablet.

The principle and the embodiment of the present disclosures are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:
1. A touch panel, comprising:
a transparent substrate; and
a light blocking layer in a touch area of the touch panel and on the transparent substrate,
wherein the light blocking layer comprises a keyboard pattern, the keyboard pattern comprises hollow characters, and the light blocking layer is configured to display the characters of the keyboard pattern on the transparent substrate by light passing through the hollow characters; and transmittance of the hollow characters is smaller than a light transmission threshold.

2. The touch panel of claim 1, further comprising a touch sensing layer in the touch area and on a side of the light blocking layer opposite from the transparent substrate.

3. The touch panel of claim 2, further comprising a light source at a side of the touch sensing layer opposite from the light blocking layer.

4. The touch panel of claim 3, further comprising a controller coupled to the light source and the touch sensing layer respectively, and wherein the controller is configured to turn on the light source to display the keyboard pattern and realize a keyboard function based on sensing of touch operation by the touch sensing layer, and wherein the controller is further configured to turn off the light source and realize a handwriting tablet function based on the sensing of touch operation by the touch sensing layer.

5. The touch panel of claim 4, further comprising:
a switch button connected to the control module;
wherein the controller is configured to control switching between the keyboard function and the handwriting tablet function of the touch panel based on a pressing operation or a touch operation on the switch button.

6. The touch panel of claim 5, wherein the switch button is a physical button in a non-touch area of the touch panel.

7. The touch panel of claim 5, wherein the switch button is a character in the keyboard pattern in the touch area of the touch panel.

8. The touch panel of claim 2, wherein the touch sensing layer comprises first channels of sensing electrodes in a first direction and second channels of sensing electrodes in a second direction, the first direction being different from the second direction.

9. The touch panel of claim 1, wherein the light transmission threshold is about 30%.

10. The touch panel of claim 1, wherein the hollow characters are completely hollowed out.

11. The touch panel of claim 1, wherein the light blocking layer comprises a plurality of black matrix blocks that are spaced apart, and the hollow characters of the keyboard pattern are on the black matrix blocks respectively.

12. An electronic apparatus, comprising: the touch panel of claim 1.

13. A touch panel, comprising:
a transparent substrate; and
a light blocking layer in a touch area of the touch panel and on the transparent substrate,
wherein the light blocking layer comprises a keyboard pattern, the keyboard pattern comprises hollow characters, and the light blocking layer is configured to display the characters of the keyboard pattern on the transparent substrate by light passing through the hollow characters; and
the hollow characters are composed of a dot matrix-shaped black matrix or a mesh-shaped black matrix.

14. A method of fabricating a touch panel, comprising:
forming a light blocking layer on a transparent substrate; and
forming a keyboard pattern in a touch area of the light blocking layer by a patterning process,
wherein the keyboard pattern comprises hollow characters; and
the hollow characters comprise at least one of a completely hollow-out character, a hollow character composed of a dot matrix-shaped black matrix, or a hollow character composed of a mesh-shaped black matrix.

15. The method of fabricating the touch panel according to claim 14, further comprising:
forming a touch sensing layer in the touch area and on a side of the light blocking layer opposite from the transparent substrate.

16. The method of fabricating the touch panel according to claim 15, wherein forming the touch sensing layer comprises:
forming a first insulating layer on the light blocking layer;
forming a first metal layer on the first insulating layer and forming a first electrode layer by performing a patterning process on the first metal layer;
forming a second insulating layer on the first electrode layer and the first insulating layer;
forming a second metal layer on the second insulating layer and forming a second electrode layer by performing a pattern processing on the second metal layer; and
forming a third insulating layer on the second electrode layer and the second insulating layer.

17. The method of fabricating the touch panel according to claim 16, wherein the first electrode layer comprises first channels of sensing electrodes in a first direction, and the second electrode layer comprises second channels of sensing electrodes in a second direction, the first direction being different from the second direction.

* * * * *